United States Patent
Mei

(10) Patent No.: US 8,698,520 B2
(45) Date of Patent: Apr. 15, 2014

(54) OUTPUT SLEW RATE CONTROL

(75) Inventor: Shizhong Mei, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/418,078

(22) Filed: Mar. 12, 2012

(65) Prior Publication Data

US 2012/0169381 A1   Jul. 5, 2012

Related U.S. Application Data

(62) Division of application No. 13/039,163, filed on Mar. 2, 2011, now Pat. No. 8,138,794, which is a division of application No. 11/592,593, filed on Nov. 3, 2006, now Pat. No. 7,902,875.

(51) Int. Cl.
  *H03K 19/094* (2006.01)

(52) U.S. Cl.
  USPC .................. 326/87; 326/30; 326/32; 326/86; 327/170

(58) Field of Classification Search
  USPC ............... 326/30–32, 82–83, 86–87; 327/170
  See application file for complete search history.

(56) References Cited

U.S. PATENT DOCUMENTS

| | | | |
|---|---|---|---|
| 5,134,311 A * | 7/1992 | Biber et al. | 327/108 |
| 5,153,462 A | 10/1992 | Agrawal et al. | |
| 5,254,883 A | 10/1993 | Horowitz et al. | |
| 5,872,736 A | 2/1999 | Keeth | |
| 5,898,321 A | 4/1999 | Ilkbahar et al. | |
| 5,917,758 A | 6/1999 | Keeth | |
| 5,949,254 A | 9/1999 | Keeth | |
| 6,037,803 A | 3/2000 | Klein | |
| 6,040,714 A | 3/2000 | Klein | |
| 6,069,504 A | 5/2000 | Keeth | |
| 6,072,729 A | 6/2000 | Casper | |
| 6,084,434 A | 7/2000 | Keeth | |
| 6,118,310 A | 9/2000 | Esch, Jr. | |
| 6,130,563 A | 10/2000 | Pilling et al. | |
| 6,256,235 B1 | 7/2001 | Lee | |
| 6,288,563 B1 | 9/2001 | Muljono et al. | |
| 6,326,810 B1 | 12/2001 | Keeth | |
| 6,362,656 B2 * | 3/2002 | Rhee | 326/87 |
| 6,437,600 B1 | 8/2002 | Keeth | |
| 6,456,124 B1 | 9/2002 | Lee et al. | |
| 6,504,396 B2 | 1/2003 | Sher et al. | |
| 6,594,168 B2 | 7/2003 | Keeth et al. | |
| 6,636,069 B1 | 10/2003 | Muljono | |
| 6,714,462 B2 | 3/2004 | Pan | |

(Continued)

*Primary Examiner* — Jason M Crawford
(74) *Attorney, Agent, or Firm* — Dorsey & Whitney LLP

(57) ABSTRACT

This document discusses, among other things, output slew rate control. Methods and structures are described to provide slew rate control of an output driver circuit such as a DRAM output driver on a die. A selectable combination of series coupled transistors are configured as a parallel array of complementary inverter pairs to provide a divided voltage to a calibrator. The calibrator is configured to respond to a differential voltage to adjust the divided voltage such that the differential voltage is forced to zero. The calibrator outputs a plurality of discrete signals from an up/down counter to toggle the individual transistors of the parallel array to increase and decrease a collective current. In some embodiments, transistor channel currents are modulated to step-adjust a voltage based on a ratio associated with a static resistance. In various embodiments, the divided voltage is an analog voltage based on a resistance associated with trim circuitry.

32 Claims, 12 Drawing Sheets

(56) References Cited

U.S. PATENT DOCUMENTS

| | | | |
|---|---|---|---|
| RE38,685 E | 1/2005 | Casper | |
| 6,844,755 B2 | 1/2005 | Ajit | |
| 6,847,560 B2 | 1/2005 | Pan | |
| 6,847,582 B2 | 1/2005 | Pan | |
| 6,897,703 B2 | 5/2005 | Hunt | |
| 7,019,553 B2 | 3/2006 | Blodgett et al. | |
| 7,035,148 B2 | 4/2006 | Chung et al. | |
| 7,038,512 B2 | 5/2006 | Wilson et al. | |
| 7,057,545 B1 | 6/2006 | Bhattacharya et al. | |
| 7,123,055 B1 * | 10/2006 | Chong et al. | 326/87 |
| 7,133,318 B2 * | 11/2006 | Chung et al. | 365/189.05 |
| 7,151,392 B2 | 12/2006 | Lee | |
| 7,459,930 B2 | 12/2008 | Mei | |
| 7,646,229 B2 | 1/2010 | Mei | |
| 7,656,209 B2 | 2/2010 | Mei | |
| 7,902,875 B2 | 3/2011 | Mei | |
| 2002/0109525 A1 | 8/2002 | Shin | |
| 2003/0006799 A1 * | 1/2003 | Ruesch | 326/30 |
| 2004/0008054 A1 | 1/2004 | Lesea et al. | |
| 2004/0076039 A1 | 4/2004 | Chung et al. | |
| 2004/0165449 A1 | 8/2004 | Pan | |
| 2004/0178824 A1 | 9/2004 | Pan | |
| 2005/0195005 A1 | 9/2005 | Choi et al. | |
| 2006/0022713 A1 | 2/2006 | Tokuhiro et al. | |
| 2006/0097764 A1 | 5/2006 | Yeh | |
| 2006/0158225 A1 | 7/2006 | Stojanovic et al. | |
| 2007/0252618 A1 * | 11/2007 | Gopalakrishnan et al. | 326/87 |
| 2008/0122510 A1 | 5/2008 | Mei | |
| 2008/0122511 A1 | 5/2008 | Mei | |

\* cited by examiner

| CONDITIONS | THE TOTAL WIDTH OF ALL TURNED ON TRANSISTORS (IN UNITS OF 0.0575 μm) | | |
|---|---|---|---|
| | Rref = 445 Ohms | Rref = 480 Ohms | Rref = 645 Ohms |
| 1.4V/FF/85°C | 510 (+8.5%) | 470 | 350 (-25.5%) |
| 1.5V/FF/25°C | 430 (+7.5%) | 400 | 300 (-25.0%) |
| 1.6V/FF/25°C | 380 (+8.6%) | 350 | 260 (-25.7%) |
| 1.4V/TT/85°C | 650 (+8.3%) | 600 | 450 (-25.0%) |
| 1.5V/TT/25°C | 500 (+8.7%) | 460 | 340 (-26.1%) |
| 1.6V/TT/25°C | 430 (+7.5%) | 400 | 290 (-27.5%) |
| 1.4V/SS/85°C | 780 (+8.3%) | 720 | 530 (-26.4%) |
| 1.5V/SS/25°C | 590 (+7.3%) | 550 | 410 (-25.5%) |
| 1.6V/SS/25°C | 500 (+8.7%) | 460 | 340 (_26.1%) |

*FIG. 10*

| CONDITIONS | SLEW RATE (V/ns) | | | |
|---|---|---|---|---|
| | WITHOUT SLEW RATE CONTROL | | WITH SLEW RATE CONTROL | |
| | RISING EDGE | FALLING EDGE | RISING EDGE | FALLING EDGE |
| 1.4V/FF/85°C | 3.43 | 3.51 | 3.41 | 3.51 |
| 1.5V/FF/25°C | 4.30 | 4.47 | 4.20 | 4.31 |
| 1.6V/FF/25°C | 4.12 | 4.36 | 3.83 | 3.82 |
| 1.4V/TT/85°C | 3.60 | 3.31 | 3.91 | 3.67 |
| 1.5V/TT/25°C | 4.50 | 4.42 | 4.50 | 4.42 |
| 1.6V/TT/25°C | 4.64 | 4.79 | 4.51 | 4.67 |
| 1.4V/SS/85°C | 3.20 | 2.33 | 3.75 | 2.90 |
| 1.5V/SS/25°C | 4.28 | 3.35 | 4.61 | 3.69 |
| 1.6V/SS/25°C | 4.74 | 4.17 | 4.74 | 4.17 |

*FIG. 11*

| CONDITIONS | SLEW RATE VARIATION RANGE (V/ns) | |
|---|---|---|
| | WITHOUT SLEW RATE CONTROL | WITH SLEW RATE CONTROL |
| 1.4V/FF/85°C | | |
| 1.5V/FF/25°C | 1.48 | 1.0 |
| 1.6V/FF/25°C | | |
| 1.4V/TT/85°C | | |
| 1.5V/TT/25°C | 1.04 | 0.90 |
| 1.6V/TT/25°C | | |
| 1.4V/SS/85°C | | |
| 1.5V/SS/25°C | 2.41 | 1.84 |
| 1.6V/SS/25°C | | |

OUTPUT SLEW RATE CONTROL

CROSS-REFERENCE TO RELATED APPLICATION

This application is a divisional of U.S. patent application Ser. No. 13/039,163, filed Mar. 2, 2011, and issued as U.S. Pat. No. 8,138,794, which application is a divisional of U.S. patent application Ser. No. 11/592,593, filed Nov. 3, 2006, and issued as U.S. Pat. No. 7,902,875. These applications and patents are incorporated by reference herein in their entirety and for all purposes.

TECHNICAL FIELD

This patent document pertains generally to control circuitry, and more particularly, but not by way of limitation, to output slew rate control.

BACKGROUND

The semiconductor device industry has a market driven need to reduce the cost of devices used in products such as processor chips, mobile telephones, and memory devices such as dynamic random access memories (DRAMs). Semiconductor companies generally rely on the ability to manufacture semiconductor products at several fabrication facilities, or use parallel process lines and different process equipment to meet demands. Different device geometries are used to obtain devices with different performance specifications. Variations in processes can result in wafer-to-wafer and die-to-die variations in device performance. Temperature and supply voltage variations can have the same result. Sometimes the variations are large enough that the end device operates outside the design specification rending it unusable for an intended application. More product must be generated to account for the loss, adding to costs. Process and related variations and differences in operating conditions have created a need for control circuitry.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

FIG. 10 is a table illustrating total on-state gate width of a transistor array for differing process, voltage and temperature conditions.

FIG. 11 is a table illustrating slew rate for one example of an output driver circuit with and without slew rate control.

DETAILED DESCRIPTION

Figure 1:
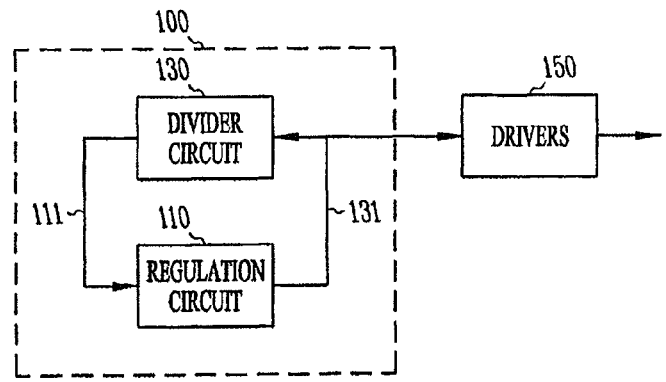
FIG. 1 is a block diagram view illustrating generally one example of a slew rate control circuit coupled to an output driver circuit.

The following detailed description includes references to the accompanying drawings, which form a part of the detailed description. The drawings show, by way of illustration, specific embodiments in which the invention may be practiced. These embodiments, which are also referred to herein as "examples," are described in enough detail to enable those skilled in the art to practice the invention. The embodiments may be combined, other embodiments may be utilized, or structural, logical and electrical changes may be made without departing from the scope of the present invention. The following detailed description is, therefore, not to be taken in a limiting sense, and the scope of the present invention is defined by the appended claims and their equivalents.

In this document, the terms "a" or "an" are used, as is common in patent documents, to include one or more than one. In this document, the term "or" is used to refer to a nonexclusive or, unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls. Transistor(s) as used herein means generally, an insulator gate field effect transistor such as a metal oxide field effect transistor (MOSFET) and include complementary metal oxide field effect transistors (CMOS), p-channel (PMOS) and n-channel (NMOS) field effect transistors. Channel refers to gate channel or the region between source and drain regions of a field effect transistor as is generally known in the art. "Typical process" refer to a MOSFET with a nominal channel conduction.

Nominal channel conduction as used herein is the average transistor channel conduction for a specified geometry (e.g., gate width and gate length) measured under specified field conditions (e.g., constant gate-source and drain-source voltages). Channel conduction typically follows a Gaussian distribution for a given transistor sample size. The term "conduction strength" as used herein refers to the magnitude of the channel conduction. Conduction strength is a product of, among other parameters, carrier mobility and transistor geometry such as gate channel width and gate channel length. Conduction strength affects the magnitude of the channel current flowing between drain and source regions and the effective channel resistance. The term "fast process" refers to conduction strength that is greater than the designed nominal conduction strength. Conversely, the term "slow process" refers to channel conduction strength that is less than the designed nominal channel conduction strength. A fast process occurs, for example, when the transistor gate channel width is greater than the nominal gate channel width, or the transistor channel length is less than the nominal gate channel length, or the channel mobility is higher than the nominal channel mobility, and may be some combination of channel length, width and mobility. A slow process occurs, for example, when the transistor gate channel width is less than the nominal gate channel width, or the transistor channel length is greater than the nominal gate channel length, or the channel mobility is lower than the nominal channel mobility, and may be some combination of channel length, width and mobility. Typical, fast and slow processes may also be used to describe the total or effective conduction strength for one or more transistors coupled in series, parallel or as an array of transistors.

A used herein, "gate width", "channel width" and "channel gate width" have the same meaning and may be used interchangeably. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

FIG. 1 is a block diagram view illustrating generally one example of a slew rate control circuit coupled to an output driver circuit. In this example slew rate control circuit 100 includes regulation circuit 110 and divider circuit 130 configured to form part of a feedback loop. A regulation circuit 110 is coupled to receive an analog voltage signal at 111 from the divider 130 and to transmit one or more discrete voltage signals at 131 to the divider 130. Driver circuitry 150 is further coupled to regulation circuit 110 to receive the one or more discrete voltage signals at 131. Regulation circuit 110 includes circuitry for regulating electrical parameters such as voltage and current. Divider 130 may include a voltage, current or resistance divider network. In some embodiments, the divider 130 may include circuitry for adjusting a voltage, current or resistance. In various embodiments, the divider 130 includes a network of transistors configured to provide an adjustable ratio using at least one of a voltage, a current and a resistance. Drivers 150 can include output driver circuitry. In an embodiment, driver circuitry 150 includes an output driver that is similar to the driver described in U.S. Pat. Nos. 6,275, 119 and 6,559,690, herein incorporated by reference. In various embodiments, the discrete voltage signals are digital signals. In some embodiments, analog signal at 111 is a quantized voltage signal.

Figure 2:
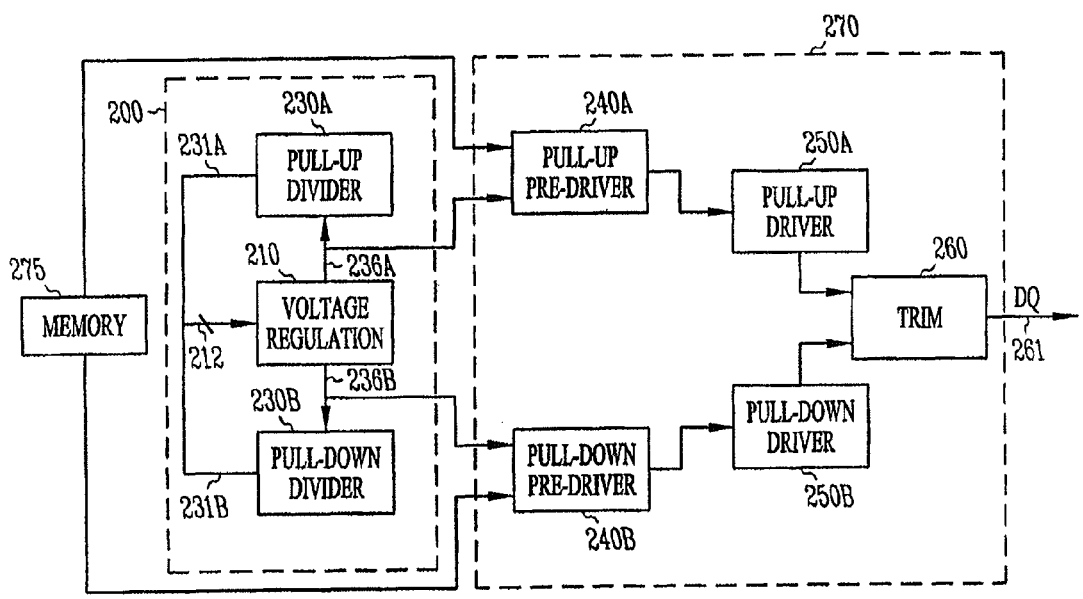
FIG. 2 is block diagram illustrating generally one example of a slew rate control circuit coupled to an output circuit.

FIG. 2 is a block diagram illustrating generally one example of a slew rate control circuit coupled to an output circuit. In this example, slew rate control circuit 200 is communicatively coupled to output driver circuit 270. Output driver circuit 270 includes pull-up driver 250A and pull-down driver 250B coupled to trim circuit 260. Data output DQ at 261 of trim circuit 260 may be coupled to a conductive bus that may be further coupled to a processor or similar device. Pull-up driver 250A and pull-down driver 250B are electrically coupled to pull-up pre-driver 240A and pull-down pre-driver 240B, respectively. The pull-up pre-driver 240A and pull-down pre-driver 240B are coupled at terminals 236A, 236B, respectively, to the voltage regulation circuit 210 to receive one or more discrete voltage signals. The pull-up pre-driver 240A and pull-down pre-driver 240B are further coupled to memory device 275 to receive data signals. The pull-up divider 230A and the pull-down divider 230B are also coupled at terminals 236A, 236B, respectively, to receive the one or more discrete voltage signals from the voltage regulation circuit 210. Pull-up divider 230A and pull down divider 230B are also coupled at terminal 231A and 231B to bus 212, respectively, to transmit analog voltages to voltage regulation circuit 210. In some embodiments, the pull-up pre-diver 230A includes a configuration that is similar to a portion of pull-up pre-diver 240A, such as 731A and 732A shown in FIG. 7A. In various embodiments, the pull-down pre-divider 230B includes a configuration similar to a portion of pull-down pre-driver 240B, such as 731B and 732B shown in FIG. 7B. In some embodiment, the pull-up divider 230A and the pull-down divider 230B include portions that are configured as 731A, 732A and 731B, 732B, respectively.

The voltage regulation circuit 210 transmits discrete voltage signals to the pull-up divider 230A and to the pull-down divider 230B at terminals 236A and 236B, respectively, based on the analog voltages received at bus 212. Voltage regulation circuit 210 thereby cooperates with pull-up divider 230A and the pull-down divider 230B to form part of a feedback path to adjust the voltage signals transmitted at 231A and 231B to the voltage regulation circuit 210. The magnitude of the voltage signals are determined by the one or more discrete voltage signals output from the voltage regulation circuit at terminals 236A and 236B. In various embodiments, analog voltage signals at terminals 231A and 231B are electrically in common such that only one analog voltage signal is received by voltage regulation circuit 210. In some embodiments, the analog signals at 231A, 231B may be quantized voltage signals. In various embodiments, the discrete voltage signals are digital signals. In some embodiments, the analog signals are based on at least one of a resistance, a current and a voltage of pull-up divider 230A and/or pull-down divider 230B and at least one static resistance such as a resistor. In various embodiments, the analog voltage signals are based on a relationship between portions of pull-up divider 230A and/or portions of pull-down divider 230B as explained below. In some embodiments, the pull-up divider 230A and the pull-down divider 230B is a replica (or copy) of a portion of the pull-up pre-divider 240A or a portion of a pull-down pre-divider 240B.

Figure 3:
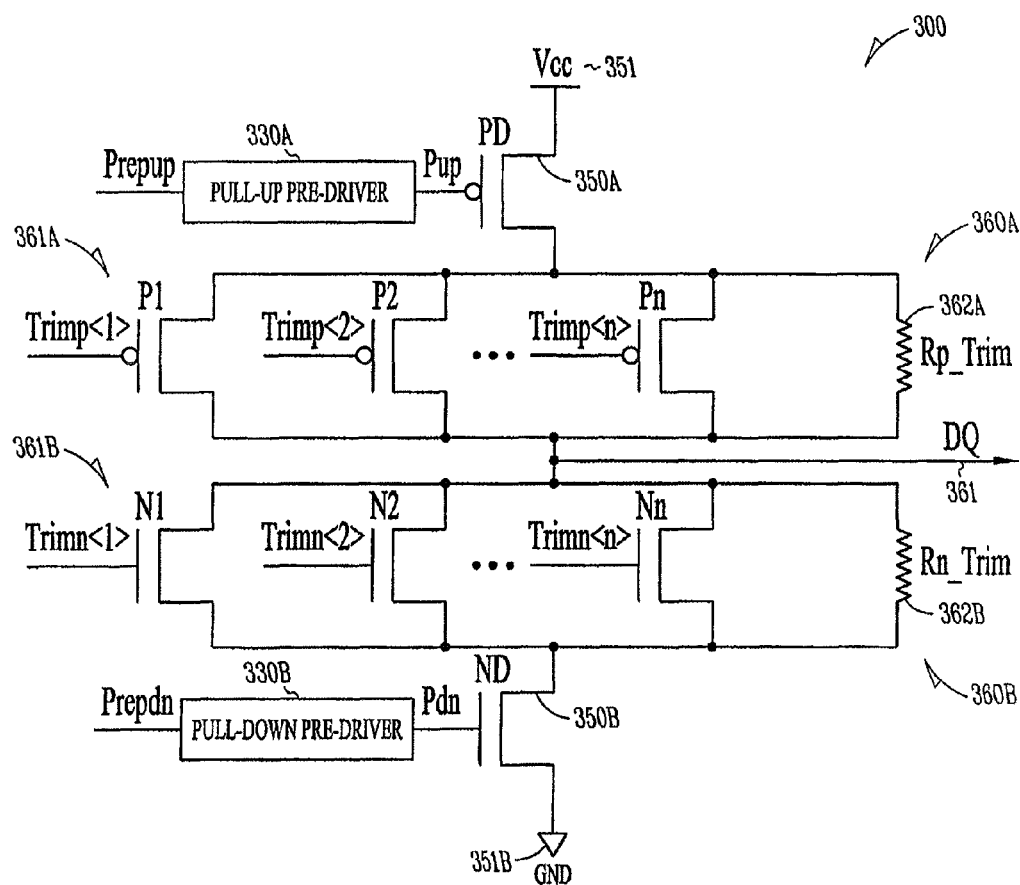
FIG. 3 is a schematic view illustrating generally one example of an output circuit.

FIG. 3 is a schematic view illustrating generally one example of an output circuit. In an example, the output circuit is for a memory such as a DRAM, SRAM, or flash memory. A typical resistance for DRAM output circuit 300 is 480 Ohms measured between the supply voltage and ground. In this example output circuit 300 includes trim circuit comprising two transistor networks 360A, 360B coupled to data output DQ at 361. The trim circuit includes one or more p-channel transistors 361A coupled in parallel with trim resistor 362A between DQ at 361 and pull-up transistor 350A. The trim circuit further includes one or more n-channel transistors 361B coupled in parallel with trim resistor 362B between DQ at 361 and pull-down transistor 350B. Values for resistors 362A, 362B may be chosen to linearize transistor networks 360A, 360B, respectively. Trim signals Trimp<1> to Trimp<n> and Trimn<1> to Trimn<n> are complementary voltages transmitted from a common source. Trim signals Trimp<1> to Trimp<n> and Trimn<1> to Trimn<n> turn on and off trim transistors 361A, 361B, respectively, to provide a specified first resistance between supply voltage 351A and DQ at 361, and to provide a specified second resistance between DQ at 361 and ground at 351B. In some embodiments, DQ at 361 is further coupled to memory that may be on a different die. In various embodiments, DQ at 361 is coupled to a conductive bus. The resistance of each transistor network 360A, 360B of trim circuit 360 may be adjusted to obtain a voltage specification at a predetermined supply voltage or temperature. In some embodiments, the channel currents of each transistor network 360A, 360B of trim circuit 360 are adjusted to achieve a specified voltage at a predetermined supply voltage or temperature. In various embodiments, the resistance or channel current of each transistor of transistor network 360A, 360B is achieved by adjusting a geometry of transistors 361A, 361lB, respectively. One example of transistor geometry is channel gate width.

Pull-up pre-drivers 330A and pull-down pre-drivers 330B of the output circuit are typically transistors functioning as inverters. The slew rate of the output circuit may be adjusted for a specified temperature and power supply voltage by iteratively adjusting a mask level geometry, such as gate width of the inverting transistors of pre-drivers 330A and 330B. Alternatively, the slew rate of the output circuit may be adjusted using control signals applied to a pre-driver circuit after fabrication.

Figure 4:
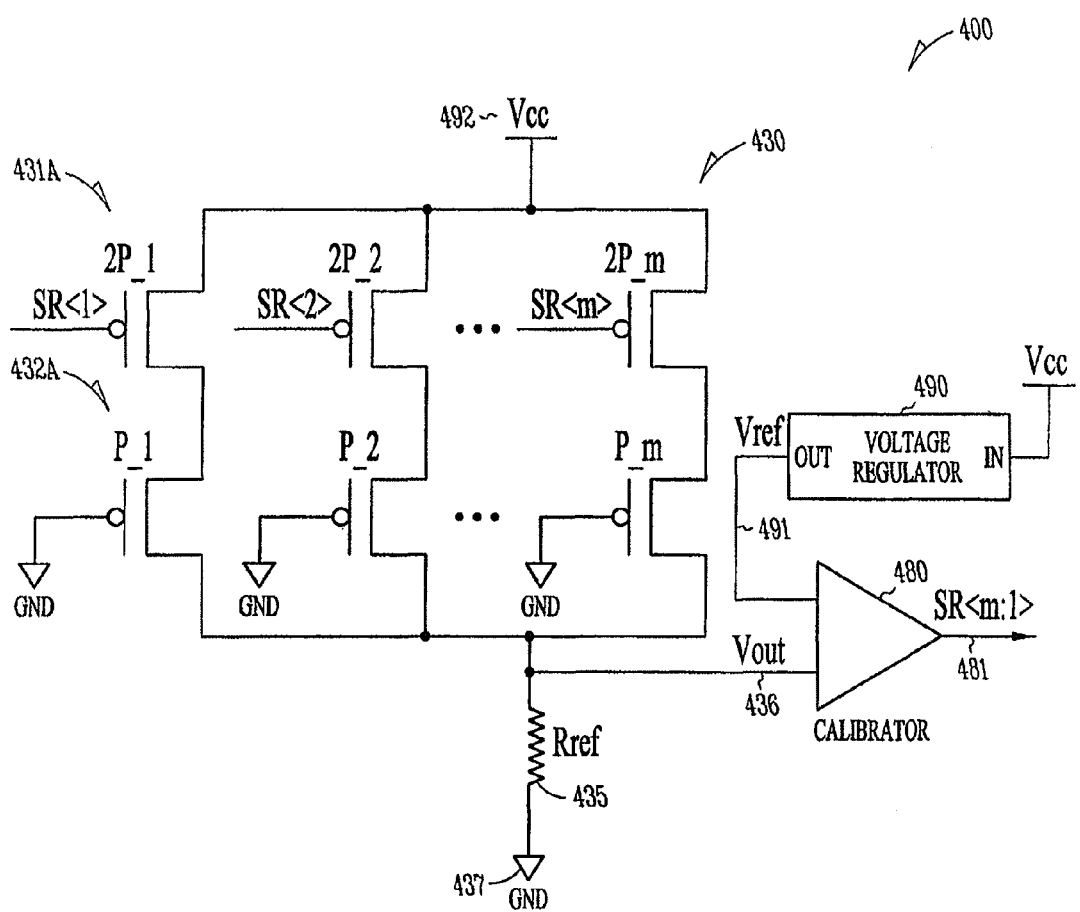
FIG. 4 is a schematic view illustrating generally one example of a circuit for monitoring process, voltage and temperature variations of a pre-driver.

FIG. 4 is a schematic view illustrating generally one example of a circuit for monitoring process, voltage and temperature variations of a pre-driver. In this example, monitoring circuit 400 includes voltage regulator 490 coupled to calibrator 480, p-channel transistor array 430 and reference resistor (Rref) 435. Transistor array 430 includes a parallel coupled array of series coupled select (or control) transistors 431A and load transistors 432A. Voltage regulator 490 is configured to transmit a reference voltage (Vref) to a calibrator 480 at 491 using Vcc. Vref is a fixed potential that is generally set less than the supply voltage (Vcc) to compensate for variations in Vcc. In some embodiments, Vref may be adjusted as necessary using voltage regulator 490 to accommodate supply voltages that range from 0.1-4.9V. In an embodiment, Vref is half of Vcc. In some embodiments, Vref may be set to within 0.1V of Vcc/2. Calibrator 480 is further coupled at 436 to transistor array 430 to receive a voltage (Vout) that is determined by the sum of the channel currents of transistor array 430 flowing through Rref. In some embodiments, transistor array 430 and Ref 435 collectively form a voltage divider network.

The threshold voltage of load transistors 432A may be adjusted to place transistors 432A in a normally-on state near zero gate-source bias. The gate electrodes of load transistors 432A are at ground potential. The gate electrodes of select transistors 431A are electrically coupled to calibrator 480 at 481 using a conductive bus. The ratio of the gate width of select transistor 431A to the gate width of load transistor 432A is 2, but may be a different ratio as necessary to achieve a specified performance. In the example of FIG. 4, a transistor geometry such as channel width for transistors P_1, P_2 . . . P_m form a geometric progression of size having a constant ratio of 2. Calibrator 480 transmits voltage signals SR<m:1> that are control signals at 481 to transistor array 430, where m is the number of parallel bit lines coupled to select transistors 431A. Vout at 436 is based on the state of the control signal SR<m:1> received by select transistors 431A and Rref 435. Vout at 436 is determined by the sum of the on-state transistor channel currents flowing through Rref 435. Low (or zero state) control signals transmitted by calibrator 480 turn on respective transistors receiving a low state signal. Similarly, high (or one state) control signals transmitted by calibrator 480 turn off respective transistors.

Vout received by calibrator at 436 is compared to Vref received at 491 using comparator circuitry included in the calibrator. Calibrator 480 typically has a high input resistance such that only a very small amount of current from transistor array 430 and regulator 490 flow into calibrator at 436 and 491, respectively. When Vout is greater than Vref, calibrator outputs control signals SR<m:1> at 481 to selectively turn off select transistors 431A thereby reducing the total channel current flowing from Vcc at 492 to ground at 437 through transistors 431A and 432A. A decrease in the total channel current results from turning off transistors 431A. The effective increase in resistance between Vcc and Vref 435, or alternatively the reduction in total channel current flowing, reduces the magnitude of Vout. This adjustment continues until Vout and Vref are equal. Similarly, when Vout is less than Vref, calibrator 480 outputs control signal SR<m:1> selectively turning on transistors 431A to increase the total current passing from Vcc at 492 to ground at 437 through transistors 431A and 432A. The corresponding decrease in effective resistance between Vcc and reference resistor 435, or alternatively, the increase in total channel current flowing through Rref 435 causes the magnitude of Vout to increase. This adjustment likewise continues until Vout and Vref are equal.

Process Compensation Example

When the conduction strength of transistor array 430 is less than desired due to some variation in a process step, for example, when a gate width is less than the design value, the individual transistor channel currents decrease contributing to a decrease in total current causing Vout to decrease. Calibrator 480 in turn outputs corresponding control signals SR<m:1> to selectively turn on transistors 431A in the array to increase the total current available to reference resistor 435, or alternatively reducing the effective p-channel array resistance, increasing Vout. Conversely, when the conduction strength of transistor array 430 increases beyond desired, for example due to a process variation resulting in one or more gate widths that are greater than the design value, then for the affected transistors the individual transistor channel currents increase, increasing Vout at 436. The calibrator transmits control signals SR<m:1> to selectively turn off transistors 431A reducing the total current available to Ref 435 to decreasing Vout. This implementation of negative feedback provides process dependent control signals SR<m:1> that may be used to adjust for channel conduction strength variations occurring during fabrication.

Voltage Compensation Example

When supply voltage Vcc increases or decreases, Vout also increases or decreases, respectively. Because Vref is a constant, the changing differential between Vout received at 436 and Vref received at 491 sensed by calibrator 480 is due to a change in Vout. The calibrator generates corresponding control signals SR<m:1> to turn-off or turn-on the channel currents of each of the select transistor 431A to reduce or increase the total current flowing through transistor array 430, depending on the direction of the change in Vout relative to Vref. Reducing the channel currents decreases Vout and increasing the channel currents increases Vout. Because calibrator 480 and transistor array 430 are configured in a feedback loop, select transistors 431A are turned on and off in a manner to cause the differential signal (Vout−Vref) to equal 0V for a given supply voltage. This implementation of negative feedback provides voltage dependent control signals SR<m:1> that may be used to adjust for variations in the voltage supply Vcc.

Temperature Compensation Example

Temperature variations have similar effects on Vout as process variations. In particular, as temperature increases, the channel current of each select transistor 431A decreases causing Vout to decrease. Conversely, decreasing temperature causes the channel current to increase causing Vout to increase. Calibrator 480 transmits control signals SR<m:1> to selectively turn-on and turn-off select transistors 431A to decrease and increase, respectively, the total current flowing to Vref 435. Vout is adjusted until differential voltage (Vout−Vref) is 0V at the particular operating temperature. Because Vref is constant, the change in (Vout−Vref) at 436 and 491, respectively, sensed by calibrator 480 is due to a change in Vout. This implementation of negative feedback provides temperature dependent control signals SR<m:1> that may be used to adjust for variations in operation temperature.

Figure 5:
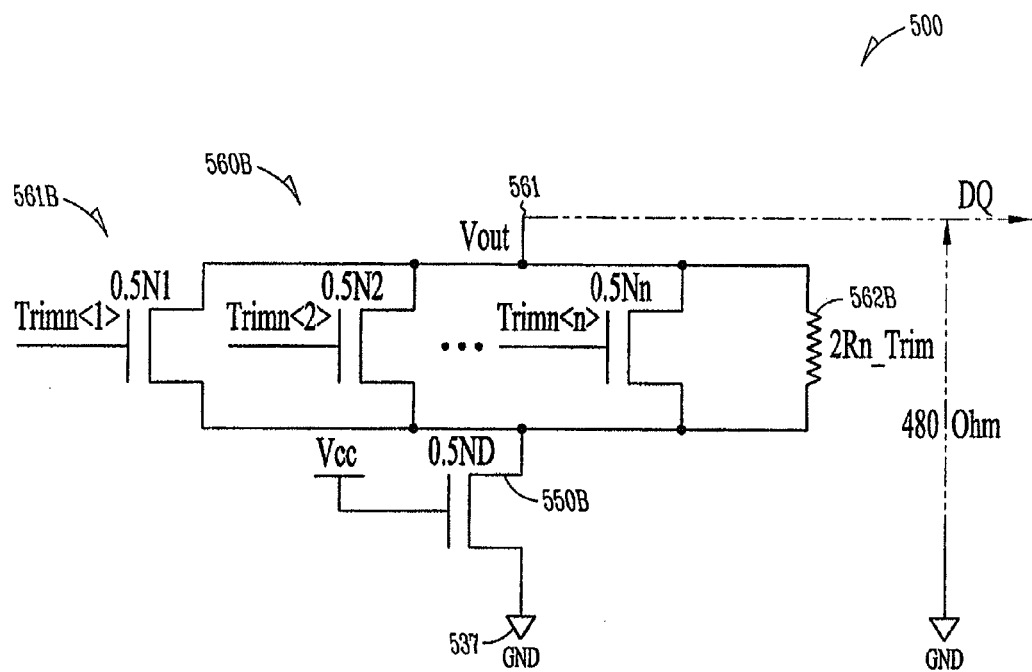
FIG. 5 is a schematic view illustrating generally one example of a circuit for implementing a resistance.

FIG. 5 is a schematic view illustrating generally one example of a circuit for implementing a resistance. Resistance circuit 500 is representative of half of a pull-down portion of an output driver circuit as described herein. In this example, trim circuit 560B approximates a reference resistor (for example, Ref. 435 of FIG. 4) having a value of 480Ω between data output (DQ) and ground when a specified number of transistors are selected to be on. Parallel coupled n-channel transistors 561B are further coupled in series with pull-down transistor 550B that serves as a load. The gate width of each trim transistor 561B and pull-down transistor 550B are scaled by half, but may be a different value. Trim resistor 562B is scaled by 2, which is the inverse of the scaled gate width. The gate width is scaled by a value selected in accordance with the intended slew rate performance. Trim resistor 562B is chosen to linearize the collective (or effective) resistance between DQ at 561 and pull-down transistor 550B for a voltage about a specified drain-source voltage. A typical value for a trim resistor 562B associated with a DRAM output driver is 300Ω. In the case where transistor gate width of 561B is scaled by half, for example, trim resistor 562B is 600Ω. A 240Ω resistance, for example, can be obtained between DQ at 561 and ground potential at 537 by coupling pairs of resistance circuit 500 with each having a resistance of 480Ω. A 240Ω resistance can also be obtained, for example, by coupling three-720Ω circuits in parallel. In some embodiments, the two or more resistance circuit 500 coupled in parallel each have different effectives resistance between DQ at 561 and ground potential at 537.

Figure 6:
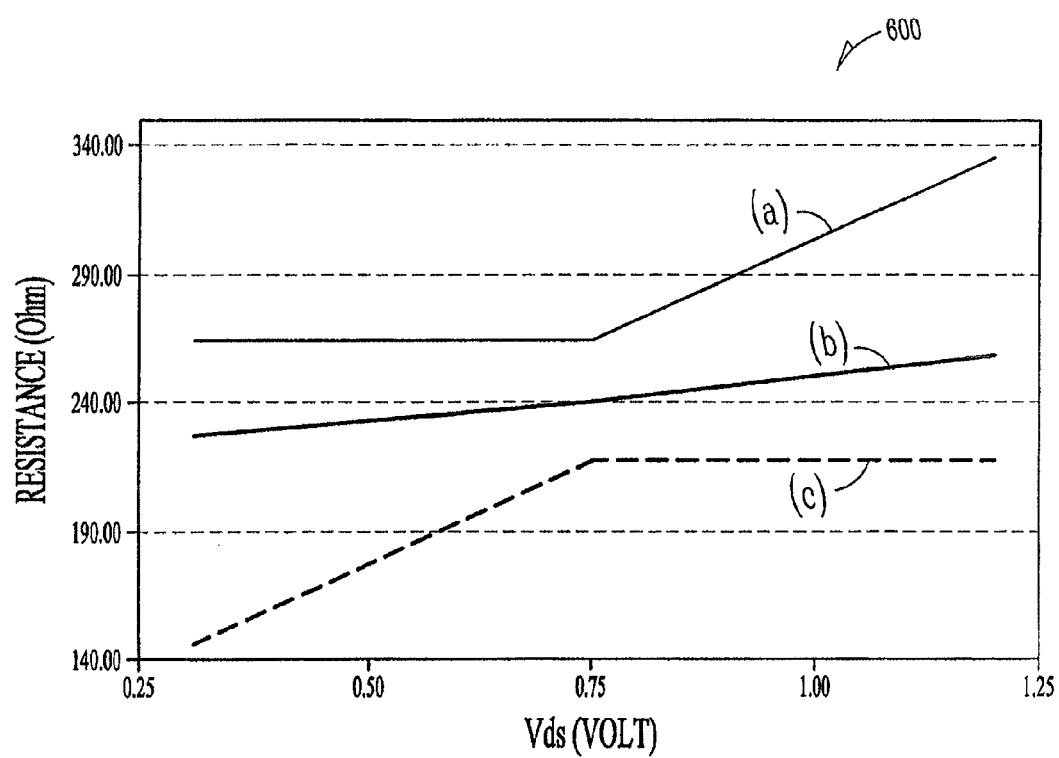
FIG. 6 is a graphic view of simulated output resistance of pull-up and pull-down portions of a driver circuit.

FIG. 6 is a graphic view of simulated output resistance of pull-up and pull-down portions of a driver circuit. Graph 600 is as plot of simulated output resistance as a function of drain-source voltage (Vds) for a design resistance of 240Ω at 0.75V. In this example, Vds is the difference between Vcc and data output DQ for the pull-up portion, and Vds is the difference between DQ and ground for the pull-down portion. The pull-up resistance is the resistance between Vcc and DQ with the gate electrode of the pull-up transistor at ground potential. The pull-down resistance is the resistance between DQ and ground with the gate electrode of the pull-down transistor at Vcc. The resistances of curve (a) and curve (c) are representative design resistances placed on design resistances for an output circuit such as shown in FIG. 3. Curve (b) is a simulation of resistance for two resistive circuits 500 shown in FIG. 5 coupled in parallel, each having a 480Ω resistance between DQ at 561 and ground potential at 537.

Figure 7A:
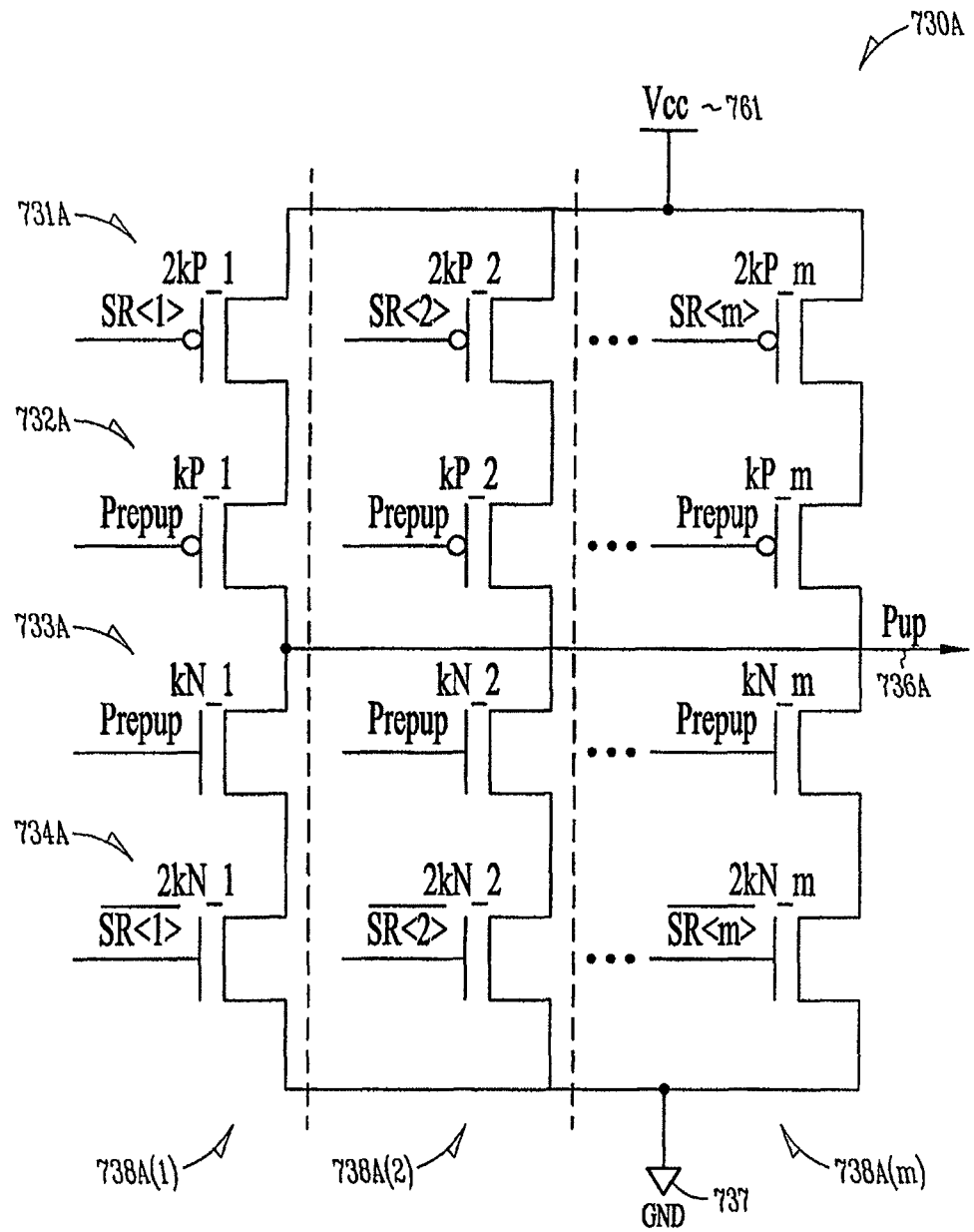
FIGS. 7A and 7B are schematic views illustrating generally examples of circuits for implementing a pull-up pre-driver and a pull-down pre-driver, respectively.
Figure 7B:
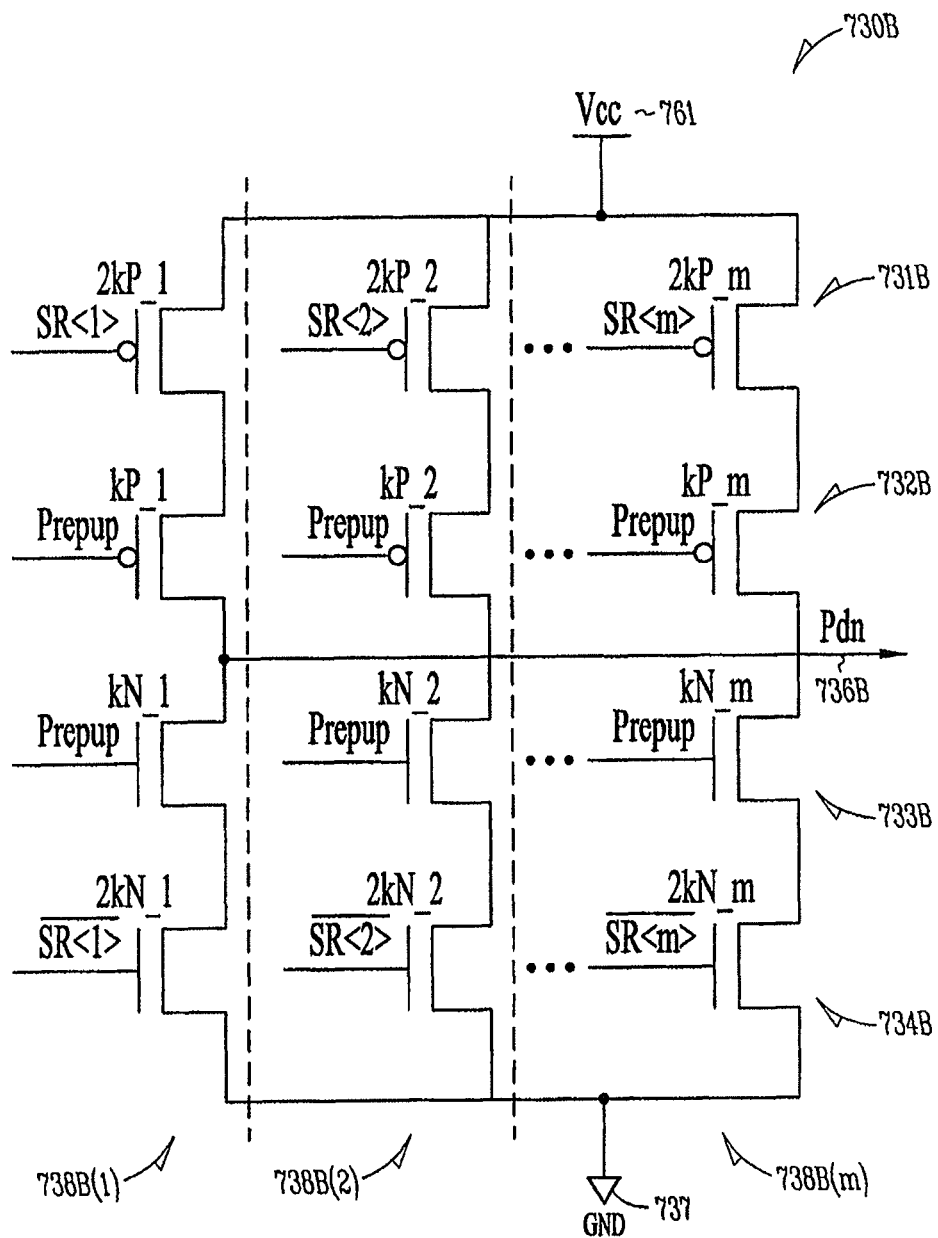

FIGS. 7A and 7B are schematic views illustrating generally examples of circuits for implementing a pull-up pre-driver and a pull-down pre-driver, respectively. In this example, pull-up pre-driver 730A and pull-down pre-driver 730B portions are in the same electrical configuration. Pull-up pre-driver includes p-channel select (or control) transistors 731A, n-channel select (or control) transistors 734A, p-channel load transistors 732A and n-channel load transistors 733A. Each of 731A, 732A, 733A, and 734A are coupled in a series configuration to form inverter pairs 738A(m:1). Inverter pairs 738A(m:1) are further coupled in parallel such that pull-up pre-driver 730A includes an array of m inverter pairs. Pull-down pre-driver includes p-channel select (or control) transistors 731B, n-channel select (or control) transistors 734B, p-channel load transistors 732B and n-channel load transistors 733B. Each of 731B, 732B, 733B, and 734B are coupled in a series configuration to form inverter pairs 738B(m:1). Inverter pairs 738B(m:1) are further coupled in parallel such that pull-down pre-driver 730B includes an array of m inverter pairs. Control signals SR<m:1> received by select transistors 731A and 731B are the state of control signals received by select transistors 734A and 734B. In various embodiments control signals control signals $\overline{SR<m:1>}$ received by select transistors 734A and 734B are the complement of control signals SR<m:1> received by select transistors 731A and 731B. In various embodiments, the control signals are parallel transmitted coded signals. In some embodiments, the control signals may be an m-bit wide signal. In various embodiments, the control signals may be sequentially transmitted signals. In some embodiments, the m-bit wide signal is associated with a counting sequence. In various embodiments, the control signals are discrete signals such as digital voltage signals or quantized analog voltage signals. Voltages available at 736A and 736B depend on the number of select transistors in each array receiving SR<m:1> control signals and the state of the control signals received. Outputs 736A, 736B of pull-up pre-driver and pull-down pre-driver, respectively, may be coupled to pull-up and pull-down circuitry, respectively, such as one or more transistors associated with an output circuit.

The transistors of pull-up and pull-down pre-driver are selected such that each inverter pair of the pull-up pre-driver 738A(m:1) and each inverter pair of the pull-down pre-driver 738B(m:1) have similar drive strengths under predetermined operating conditions. In some embodiments, the geometries of the p-channel transistors and the n-channel transistor are selected so that each p-channel pair of a respective inverter pair has a similar drive strength as each n-channel pair. In various embodiments, the gate width of each of the transistors 731A, 731B, 734A and 734B receiving a control signal SR<m:1> are double the width of each of the load transistors 732A, 732B, 733A and 733B. Each pull-up pre-driver 730A and pull-down pre-driver 730B further include a geometry such as a channel width that is scaled by a value k. Scale factor k may be estimated from slew rate simulations to achieve an output slew rate specification. In general, increasing k increases output slew rate and decreasing k decreases output slew rate. For example, if the simulated output slew rate for a particular configuration is less than the minimum design specification, k is made larger than 1. Conversely, if the measured output slew rate for a particular configuration exceeds the maximum design specification, k is made less than 1. The geometry scale factor k is equivalent to scaling Rref 435 of FIG. 4. In some embodiments, p-channel transistor 731A, 732A (and/or 731B, 732B) use a geometry scale factor kp that is different from the n-channel 733A, 734A (and/or 733B, 734B) geometry scale factor kn. In various embodiments, Rref is an external resistance such as a resistor that is electrically coupled to a chip pin of a circuit, for example, volatile memories such as DRAM or non-volatile memories. In some embodiments, Rref is an internally calibrated resistance. In various embodiments Rref is a shunt resistance coupled across a portion of driver circuit between output at 561A and ground at 537 (as shown in FIG. 5).

Figure 8:
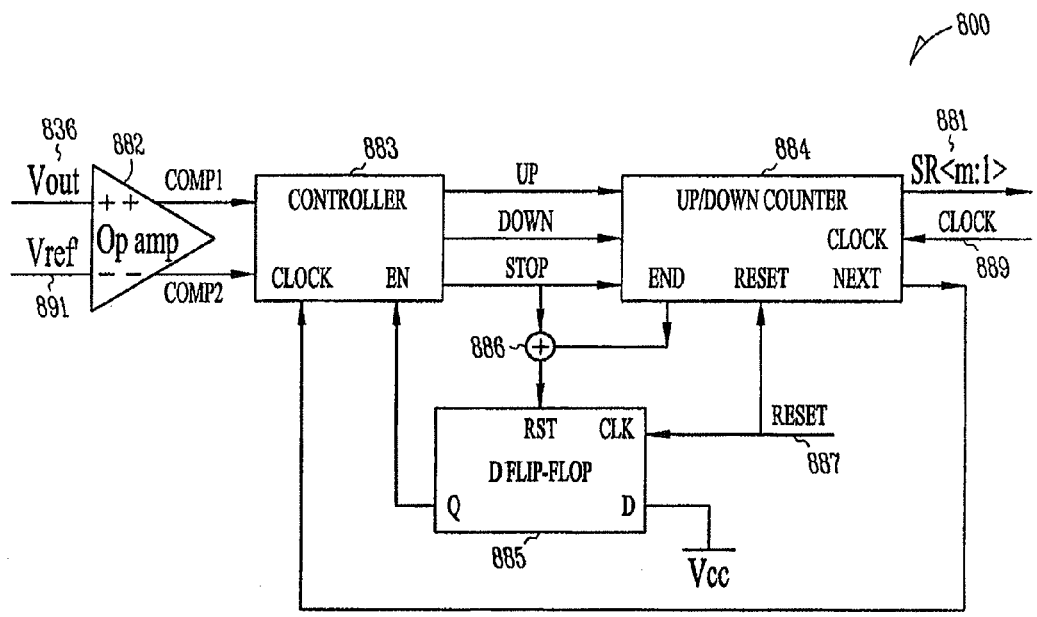
FIG. 8 is a schematic view illustrating generally one example of a circuit for implementing a calibrator.

FIG. 8 is a schematic view illustrating generally one example of a circuit for implementing a calibrator. In this example, calibrator 800 is configured to transmit control signal SR<m:1> at 881 and to receive a voltage such as divider output at 436 generated from the combination of transistor array 430 and Rref 435 (as shown in FIG. 4). A delay circuit such as a D flip flop is used to activate and deactivate the calibrator. Operational amplifier 882 is configured to operate as a comparator and is coupled to receive Vref at 891 and Vout at 836. In some embodiments, operational amplifier 882 is a differential amplifier such as a differential voltage signal amplifier. Operational amplifier 882 transmits at least one voltage to controller 883 based on the difference between Vout and Vref. When Vref and Vout are equal, outputs Comp1 and Comp2 are either both a logic one or a logic zero. When Vout exceeds Vref, Comp1 is a logic 1 and Comp2 is a logic zero. Conversely, when Vout is less than Vref, Comp1 is a logic zero and Comp2 is a logic one. In some embodiments, a logic one is a high signal state and a logic zero is a low signal state. In various embodiments, Vout and Vref are analog signals. In some embodiments, Vout and Vref are quantized analog signals.

Controller 883 is enabled to accept (or register) and decode signals when a signal is received at controller input En output by D flip-flop 885. When enabled, controller 883 registers Comp1 and Comp2 at the transition of a clock signal received from the Next signal transmitted from sequential up/down counter 884. Signals based on the registered signals are output from controller 883 to up/down counter 884. Up/down counter 884 increments a maximum of m−1 times and stops, where m is the number of calibrator bit line outputs SR<m:1> at 881, according to the following:

If Comp1 is logic 1 and Comp2 is logic zero, a count up signal is transmitted to up/down counter to initiate a count up sequence;

if Comp1 is logic zero and Comp2 is logic 1, a count down signal is transmitted to up/down counter to initiate a count down sequence; and if Comp1 and Comp2 are equal, a stop signal is transmitted to up/down counter to disable counting and to reset input of D flip-flop 885 at 886 to idle controller.

Controller 886 is enabled by a subsequent low to high transition received at En from D flip-flop 885 by external reset command received by D flip-flop 885 at clock input at 887. A transition from low to high at reset input of up/down counter 884 at 887 initializes outputs SR<m:1> at 881 to values 0 1 1 . . . 1. In some embodiments, SR<m:1> at 881 are conductive lines or wires such as a conductive bus or a data bus. Output SR<m:1> change by $2^{m-2}, 2^{m-3}, \ldots 2^0$ after each counting operation. Counting is synchronous with clock signal input at 889 received from a clock generator. In various embodiments, signals output at SR<m:1> are discrete voltages signals such as digital voltage signals or quantized analog voltage signals. In some embodiments, SR<m:1> is a code such as a interdependent synchronous code associated with a counting sequence.

Figure 9:
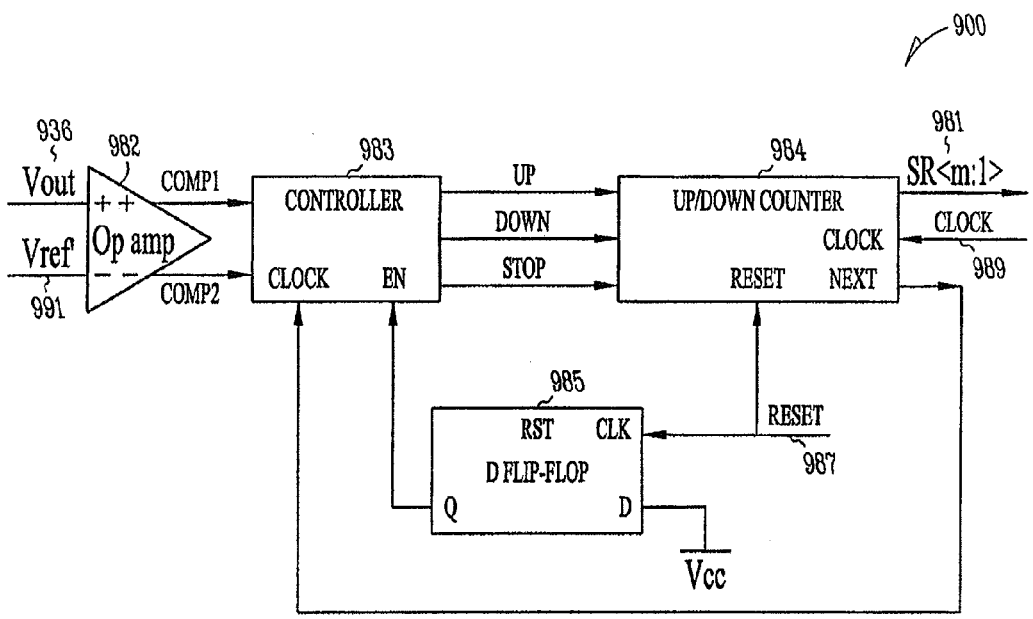
FIG. 9 is a schematic view illustrating generally one example of a circuit for implementing a calibrator.

FIG. 9 is a schematic view illustrating generally one example of a circuit for implementing a calibrator. In this example, calibrator 900 is configured to transmit control signal SR<m:1> at 981 and to receive a voltage such divider output at 436 generated from the combination of transistor array 430 and Rref 435 (as shown in FIG. 4). A delay circuit such as a D flip flop is used to activate and deactivate the calibrator. Operational amplifier 982 is configured to operate as a comparator and is coupled to receive Vref at 991 and Vout at 936. In some embodiments, operational amplifier 982 is a differential amplifier. Operational amplifier 982 transmits at least one voltage to controller 983 based on the difference between Vout and Vref. When Vref and Vout are equal, outputs Comp1 and Comp2 are either both a logic one or a logic zero. When Vout exceeds Vref, Comp1 is a logic 1 and Comp2 is a logic zero. Conversely, when Vout is less than Vref, Comp1 is a logic zero and Comp2 is a logic one. In some embodiments, a logic one is a high signal state and a logic zero is a low signal state. In various embodiments, Vout and Vref are analog signals. In some embodiments, Vout and Vref are quantized analog signals.

Controller 983 is enabled to accept (or register) and decode signals when a signal is received at controller input En output from D flip-flop 985. When enabled, controller 983 registers Comp1 and Comp2 at the transition of a clock signal received from the Next signal transmitted from sequential up/down counter 984. Sampling of Comp1 and Comp2 is periodic and continues in a free-running state until disabled by an idle command signal received at En transmitted by D flip-flop 985. Controller idle command is initiated by external command at 987 and includes a user initiated command. Signals based on the registered Comp1 and Comp2 signals are output from controller 983 to up/down counter 984. Up/down counter 984 increments calibrator outputs SR<m:1> at 981, where m is the number of calibrator bit line outputs, according to the following:

If Comp1 is logic 1 and Comp2 is logic zero, a count up signal is transmitted to up/down counter to initiate a count up sequence;

if Comp1 is logic zero and Comp2 is logic 1, a count down signal is transmitted to up/down counter to initiate a count down sequence; and if Comp1 and Conp2 are equal, a stop signal is transmitted to up/down counter to idle counting.

Up/down counter 984 is reset by receiving a signal at 987 initiated by external command and includes a user initiated command.

A transition from a logic 0 to logic 1 (or a low to a high state) at reset input at 987 of up/down counter 984 initializes outputs SR<m:1> at 981. In some embodiments, SR<m:1> at 981 is coupled to conductive lines or wires such as a conductive bus or a data bus. During a count up operation, the rightmost bit with value 0 changes from 0 to 1. During count down operation the leftmost bit with value 1 changes from 1 to 0. Counting is synchronous with clock signal input at 989 received from a clock generator. In various embodiments, signals output at SR<m:1> are discrete voltages such as digital voltage signals and quantized analog voltage signals. In some embodiments, SR<m:1> is a code such as a interdependent synchronous code associated with a counting sequence.

FIG. 10 is a table illustrating total on-state gate width of a transistor array for differing process, voltage and temperature conditions. In this example, Table 1 represents a simulation for a slew rate control circuit using a DDR3 DRAM output circuit. The values given in Table 1 represent the total gate width of all on-state PMOS select transistors of a pre-driver circuit such as 730A (or 730B) with m=7, Vcc=1.5V, Vref=0.5V, and K=1. The total on-state gate width of the NMOS transistor (not shown) is half the total on-state gate width of the PMOS transistors. Table 1 data are simulations using a calibrator and three different reference resistors of 445Ω, 480Ω and 645Ω. The 480Ω resistance is implemented using the pull-down portion (e.g., 560B) of the driver output circuit similar to that of FIG. 5, while the 445Ω and 635Ω are fixed resistances such as a resistor (e.g., Rref of FIG. 4). Control signals at output S<m:1> from the calibrator are coupled to each select transistor such that the signals received by p-channel select and the n-channel select transistors are shared signals. In some embodiments, Ref is an internal resistance specified by circuit fabrication processes. In various embodiments, Rref is an external resistance such as a resistor.

The designations TT, FF and SS refer to typical, fast and slow processes for p-channel 731A (or 731B) and n-channel 734A (or 734B) select transistors, respectively. The TT designation corresponds to a collective nominal channel conductance strength for p-channel and n-channel transistors. The FF designation corresponds to a collective channel conductance strength that is greater than the collective nominal channel conductance strength for the p-channel and n-channel transistors. The SS designation corresponds to a collective conduction strength that is less than the collective nominal channel conductance strength for the p-channel and n-channel transistors. The transistor gate widths for kP_1, kP_2, ..., kP_7 are 0.575, 1.15, 2.3, 4.6, 9.2, 18.4, and 18.4 microns, respectively. Transistor gate widths for kN_1, kN_2, ..., kN_7 are 0.2875, 0.575, 1.15, 2.3, 4.6, 9.2, and 9.2 microns, respectively. The total gate width of all turned transistors on decreases as temperature decreases and increases as supply voltage decreases. For each of the 445Ω and 645Ω fixed Rref, the total gate width is proportional to the resistance calculated using the 480Ω pull-down portion of the driver output circuit. The change in total gate width with process, voltage and temperature is a linear relationship. Consequently, slew rate may adjusted by the geometry scale factor k, similar to changing Rref. Typical values for k range between 0.9 and 1.2, but may be any value constrained partly by chip circuit density. In various embodiments, Rref is an internal resistance such as an internally calibrated non-adjustable resistor. In some embodiments, Rref is an external resistance such as a resistor coupled to the pre-drivers using pins associated with a chip package.

FIG. 11 is a table illustrating slew rate for one example of an output driver circuit with and without slew rate control. In this example, k is set to 1 and m is set to 7. Slew rate control is obtained using a calibrator circuit such as described above. The designations TT, FF and SS refer to typical, fast and slow processes for all transistors in the pre-driver and driver circuits. For pre-drivers, the transistor gate widths for kP_1, kP_2, ..., kP_7 are 0.575, 1.15, 2.3, 4.6, 9.2, 18.4, and 18.4 microns, respectively. Transistor gate widths for kN_1, kN_2, ..., kN_7 are 0.2875, 0.575, 1.15, 2.3, 4.6, 9.2, and 9.2 microns, respectively. The Rref value of 480Ω is implemented using output driver circuit 500 as a replica (shown in FIG. 5). The output slew rate variation is less with slew rate control than without slew rate control.

Figure 12A:
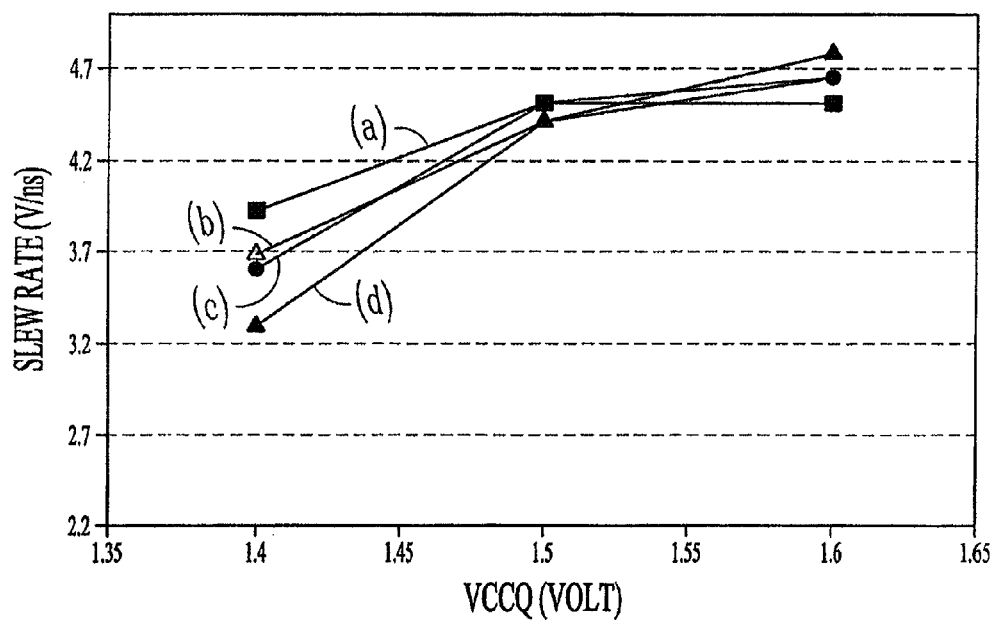
FIG. 12A is a graphic view of simulated slew rates using an output circuit with nominal gate channel strength.

FIG. 12A is a graphic view of simulated slew rates shown in FIG. 11 for an output circuit with a nominal channel conduction strength. In this example, the data of Table 2 is plotted for the TT process. Curves (c) and (d) are rising and falling slew rates, respectively, without slew rate control. Curves (a) and (b) are rising and falling slew rates, respectively, with slew rate control. Slew rate control decreases the variations in both rising and falling slew rates over the specified supply voltage range.

Figure 12B:
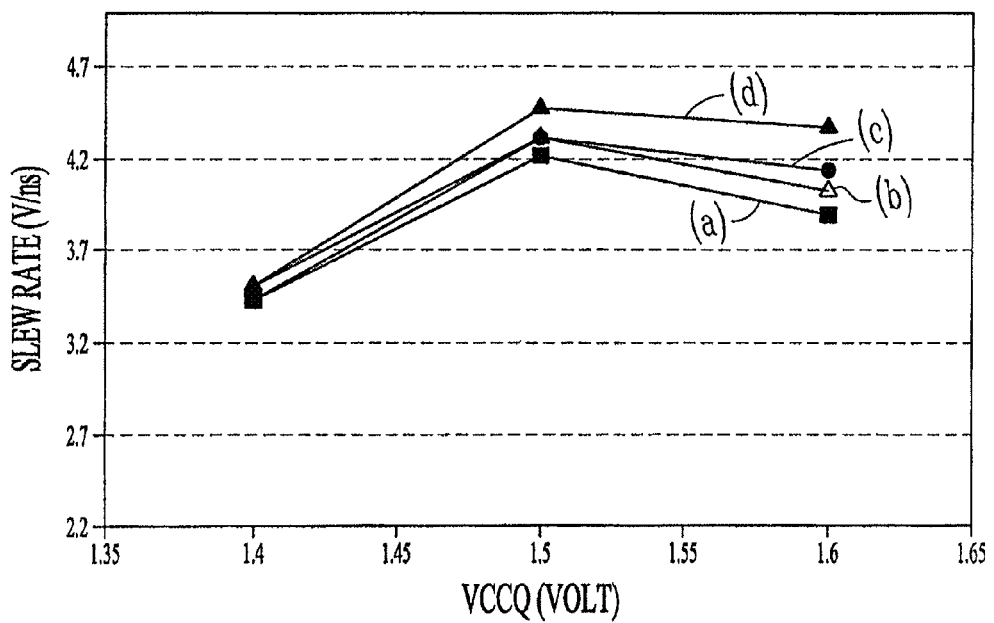
FIG. 12B is a graphic view of simulated slew rates using an output circuit with a channel conduction strength greater the nominal gate channel strength.

FIG. 12B is a graphic view of simulated slew rates shown in FIG. 11 for an output circuit with a channel conduction strength that is greater than the nominal gate channel strength of the TT process. In this example, the data of Table 2 is plotted for the FF process. Curves (c) and (d) are rising and falling slew rates, respectively, without slew rate control. Curves (a) and (b) are rising and falling slew rates, respectively, with slew rate control. Slew rate control decreases the variations in both rising and falling slew rates over the specified supply voltage range.

Figures 12C, 13:
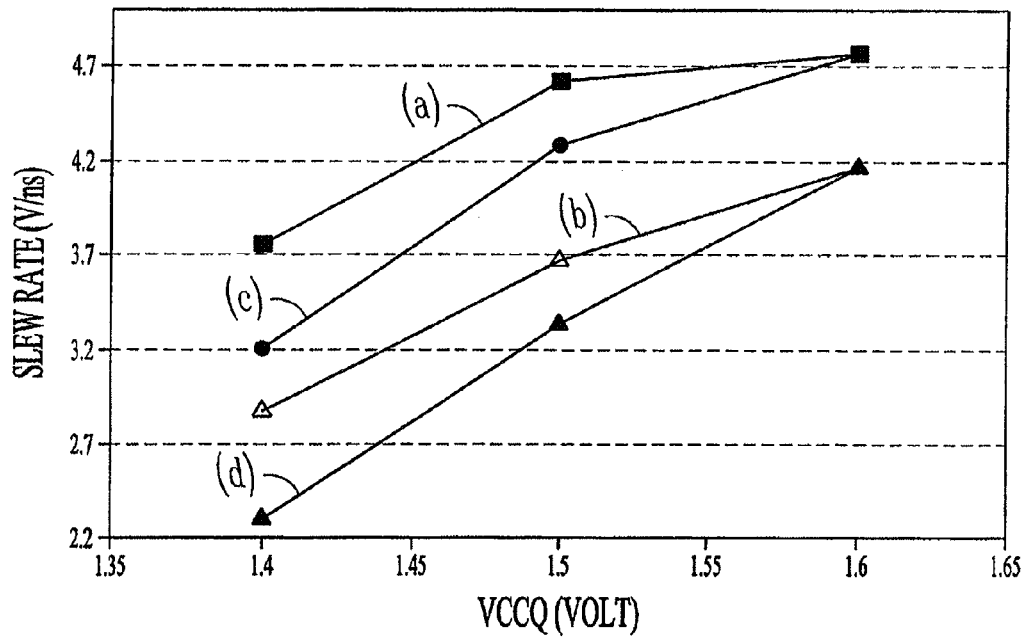
FIG. 12C is a graphic view of simulated slew rates using an output circuit with a channel conduction less than the nominal gate channel strength.
FIG. 13 is a table illustrating simulated slew rates for an output driver circuit with and without slew rate control.

FIG. 12C is a graphic view of simulated slew rates shown in FIG. 11 for an output circuit with a channel conduction strength that is less than the nominal gate channel strength of the TT process. In this example, the data of Table 2 is plotted for the SS process. Curves (c) and (d) are rising and falling slew rates, respectively, without slew rate control. Curves (a) and (b) are rising and falling slew rates, respectively, with slew rate control. Slew rate control decreases the variations in both rising and falling slew rates over the specified supply voltage range.

FIG. 13 is a table illustrating simulated slew rate variation for an output driver circuit with and without slew rate control. The data of Table 3 represents the range of the rising and falling slew rates for the data of FIGS. 12A, 12B and 12C for TT, FF and SS processes, respectively, for a DRAM output driver. With slew rate control, the slew rate variation for each of the three processes due to variation in temperature and voltage decreases over that without slew rate control. The variation in slew rate also decreases between TT, FF and SS processes with slew rate control.

Figure 14:
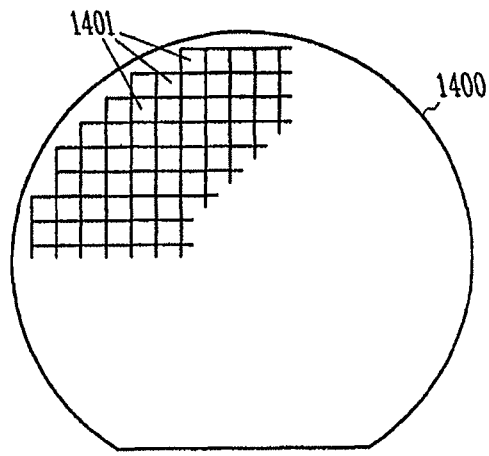
FIG. 14 is a surface view illustrating a substrate with die.

FIG. 14 is a surface view illustrating a substrate with die. In this example, die 1401 produced from a silicon wafer 1400 includes slew rate control circuit 100, and output driver circuit 150 and may include memory 275. Die 1401 are individual patterned on the silicon substrate and may include additional circuitry to perform a specific function. Typically, silicon wafer 1400 will be a repeated pattern with die having the same functionality. Die 1401 is typically packaged in a protective casing (not shown) with leads extending therefrom (not shown) providing access to the circuitry of die 1401 for unilateral or bilateral communication and control. In some embodiments, die 1401 include control circuitry associated with memory such as DRAM, SRAM and flash memory. In various embodiments, die 1401 includes memory such as DRAM, SRAM and flash memory. In some embodiments, slew rate control circuit 100 may be manufactured in separate components on separate die and assembled to form the slew rate control circuit.

Figure 15:
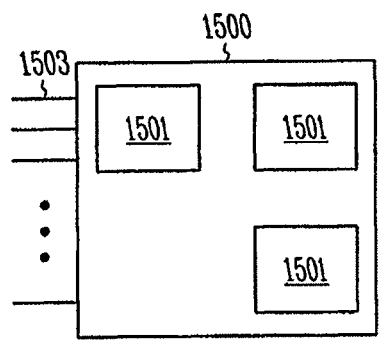
FIG. 15 is a block diagram view illustrating a circuit module with a plurality of die.

FIG. 15 is a block diagram view illustrating a circuit module with a plurality of die. In this example, circuit module 1500 includes a combination of die 1501 having the same functionality. Some examples of circuit module 1500 include memory modules, device drivers, power modules, communication modems, processor modules and application-specific modules and may include multi-layer, multi-chip modules. Circuit module 1500 may be a sub-component of a variety of electronic systems, such as a clock, a television, a cell phone, a personal computer, an automobile, an industrial control system, an aircraft and others. Circuit module 1500 will have a variety of leads 1503 extending therefrom providing unilateral or bilateral communication and control. In some embodiments, circuit module 1500 includes a combination of die 1501 having different functionality. In some embodiments, die 1501 include control circuitry associated with memory such as DRAM, SRAM and flash memory. In various embodiments, die 1501 include memory such as DRAM, SRAM and flash memory.

Figure 16:
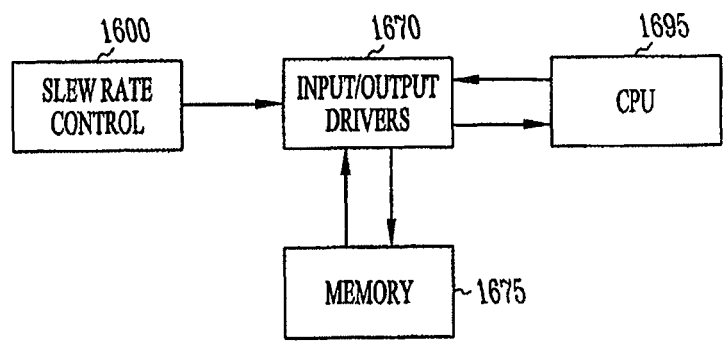
FIG. 16 is a block diagram view illustrating generally one example of a slew rate control circuit coupled to a driver circuit, memory and a processor unit.

FIG. 16 is a block diagram view illustrating generally one example of a slew rate control circuit coupled to a driver circuit, a memory and a processor unit. In this example, slew rate control circuit 1600 includes a divider network and is electrically coupled to input/output drivers 1670. Drivers 1670 include pre-driver circuitry and is further communicatively coupled to memory unit 1675 using read-write bit lines. Memory unit 1675 may be bi-directionally coupled to CPU 1695 by data bus using input/output drivers 1670. Read circuitry and write circuitry are provided to enable data to be read from and written into the memory unit. In some embodiments, the memory unit includes a DRAM, a SRAM or a flash memory.

CONCLUSION

An important figure of merit of DRAM output circuit is output slew rate. Variations in fabrication processes, supply voltage, and operation temperature (PVT) for example, can cause the slew rate to differ from the intended design, which in turn can affect output signal integrity. For a DRAM output circuit good output signal integrity generally requires a slew rate variation between 2.5 V/ns and 5 V/ns across anticipated variations in PVT. Due to wide-ranging variation in PVT, a DRAM output circuit without a slew rate control circuit is unlikely to maintain this slew rate specification. One possible solution is to provide metal options at the mask level. This solution uses the slew rate measured at the intended operating temperature range and supply voltage after fabrication. If the slew rate is outside the specification, a new geometry is selected that is believed will tune the output circuit to be within the required specification. The circuit is again fabricated and measured. Iterative tuning imposes an additional and significant manufacturing burden. A slew rate control circuit is proposed that monitors changes in PVT and adjusts the drive strength of the pre-drivers accordingly.

Disclosed herein, among other things, is a slew rate control circuit. According to various embodiments, a voltage regulation circuit configured to provide an output voltage based on a ratio of the resistances associated with the active circuit elements is electrically coupled to provide voltage signals to an array of active circuit elements such as transistors. The output voltage is further coupled to the voltage regulation circuit in a feedback loop used for selecting the active circuit elements. Various embodiments include a voltage regulation circuit configured to transmit a voltage associated with a driver circuit. In some embodiments, the voltage regulation circuit is configured as a calibrator circuit. In various embodiments, the resistive elements are p-channel and n-channel transistors. In some embodiments, the output of the voltage regulation circuit includes one or more parallel conductors such as a conductive bus or a data bus. Various embodiments include a resistor substituted for a portion of the array of active circuit elements. In some embodiments, a parallel coupled array of pairs of series coupled p-channel transistors is further coupled in series to a parallel coupled array of pairs of series coupled n-channel transistors. In various embodiments, series coupled pairs of p-channel transistors and series coupled pairs of n-channel transistors are configured as inverter pairs. In some embodiments, the slew rate control circuit provides a voltage to one or more pre-drivers to compensate for slew rate variations due to changes in process, voltage and temperature.

In one example, a voltage regulation circuit includes a voltage regulator electrically coupled to a power source and to a calibrator. In some embodiments, the output of the calibrator is electrically coupled to transmit a voltage using parallel conductors such as a conductive bus or data bus. In various embodiments, the calibrator is configured to transmit voltage signals to a plurality of resistive elements and to receive a voltage signal associated with the resistive elements. In various embodiments, the resistive elements include transistors. In some embodiments, the calibrator is electrically coupled to a driver circuit and a plurality of resistive elements. In various embodiments, the driver circuit is electrically coupled to a memory unit and a calibrator. In some embodiments, the memory unit includes driver circuitry. In various embodiments, the driver circuit includes one or one or more pre-drivers. In some embodiments, the driver circuit includes one or more output drivers and one or more pre-drivers.

In one example, a calibrator includes a controller electrically coupled to a differential amplifier and a synchronous counting circuit such as an up/down counter. In various embodiments, the controller transmits a signal to a counter to increment or decrement a counting sequence based on a signal received from the differential amplifier. In some embodiments, the counter transmits a plurality of discrete voltage such as a digital signals. Various embodiments include discrete signals that are interdependent. In some embodiments, the counter continues to count until an end signal is received by the counter. In various embodiments the counter continues to count until an external command signal is received. In various embodiments, the calibrator determines a voltage differential between a reference circuit and a divider circuit. In some embodiments, the calibrator adjusts a resistance ratio based on a voltage differential. In various embodiments, the divider is a resistance divider. In some embodiments, the divider is a current divider. In some embodiments, the divider is a voltage divider. In various embodiments, the calibrator is formed on the same substrate as the memory unit. In some embodiments, the calibrator is formed on the same substrate as the pre-driver circuitry. In various embodiments, the calibrator is formed on the same substrate as the driver circuitry and the pre-driver circuitry.

Simulations for the proposed slew rate control circuit show the output slew rate varies 0.57 V/ns less than without slew rate control across a specified PVT range.

It is to be understood that the above description is intended to be illustrative, and not restrictive. For example, the above-described embodiments (and/or aspects thereof) may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract is provided to comply with 37 C.F.R. §1.72 (b), which requires that it allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment.

What is claimed is:

1. A driver circuit comprising:
a first divider circuit comprising a paired array of PMOS transistors coupled to receive M interdependent voltage signals;
a second divider circuit comprising a paired array of NMOS transistors coupled to receive N interdependent voltage signals, wherein the state of the N and M interdependent voltage signals share a common source; and
wherein the first divider circuit and the second divider circuit are electrically configured to include at least one collective voltage output and the M and N voltage signals are selected according to a counting sequence.

2. The driver of claim 1, wherein each of the first divider circuit and the second divider circuit are configured to receive a synchronous code.

3. The driver of claim 1, wherein the M and N voltage signals are array state signals.

4. The driver of claim 3, wherein the M and N voltage signals are based on an m-bit wide control signal.

5. The driver of claim 1, wherein each pair in the paired array of PMOS transistors and each pair in the paired array of NMOS transistors include a select transistor and a load transistor configured in series.

6. A driver circuit comprising:
a first circuit comprising M parallel coupled pairs of series coupled p-channel transistors configured to receive M voltage signals;
a second circuit comprising N parallel coupled pairs of series coupled n-channel transistors configured to receive N voltage signals, wherein N and M are equal, wherein the N signals and the M signals are shared state signals, and wherein the M voltage signals and N voltage signals include a same voltage signal; and
wherein the effective resistance of the first circuit and the effective resistance of the second circuit are based on the M and N voltage signals and wherein at least one of the first circuit and the second circuit include an output configured to provide a voltage based on a ratio of the effective resistances of the first circuit and the second circuit.

7. The driver circuit of claim 6, wherein the first circuit and the second circuit include series coupled p-channel transistors and series coupled n-channel transistors configured to as inverter pairs.

8. The driver circuit of claim 7, wherein the inverter pairs include two select transistors and two load transistors.

9. The driver circuit of claim 8, wherein the first circuit and the second circuit are configured to receive signals from a counting circuit.

10. The driver circuit of claim 6, wherein the first circuit and the second circuit are formed on a single substrate.

11. The driver circuit of claim 6, wherein the output is electrically coupled to at least one of a differential amplifier and an output driver circuit.

12. The driver circuit of claim 6, wherein the driver circuit is coupled to a memory device.

13. The driver circuit of claim 6, wherein at least one of the first circuit and the second circuit is configured to adjust at least one of an aggregate channel conductance and an aggregate channel current.

14. The driver circuit of claim 6, wherein the first circuit and the second circuit are configured to provide a voltage based on at least one of a combination channel currents flowing in the first circuit and a combination of channel currents flowing in the second circuit.

15. The driver circuit of claim 6, wherein the ratio is based on one or more currents flowing between the first circuit and the second circuit.

16. The driver circuit of claim 6, wherein the ratio is based on the collective conduction strength of the first circuit and the second circuit.

17. A divider circuit comprising:
a first circuit comprising pairs of series coupled PMOS transistors configured in parallel to receive M voltage signals;
a second circuit comprising at least one of a shunt resistor and pairs of series coupled NMOS transistors, the pairs of series couple NMOS transistors configured in parallel to receive N voltage signals; and
wherein the first circuit is communicatively coupled to the second circuit to provide a specified output voltage.

18. The divider circuit of claim 17, wherein the first circuit and the second circuit are formed on separate substrates.

19. The divider circuit of claim 17, wherein the pairs of series coupled PMOS transistors and the pairs of series coupled NMOS transistors are configured to provide the specified output voltage to a calibrator.

20. The divider circuit of claim 17, wherein the pairs of series coupled PMOS transistors are configured to receive an m-bit synchronous signal based on the specified output voltage.

21. The divider circuit of claim 17, wherein the first circuit or the second circuit are configured to provide the specified output voltage based on at least one of one or more first channel currents in the first circuit and one or more second channel current in the second circuit.

22. The divider circuit of claim 21, wherein at least one of the first circuit and the second circuit are configured to provide the specified output voltage based on at least one of one or more first channel currents in the first circuit and one or more second channel current in the second circuit.

23. The divider circuit of claim 21, wherein an output associated with the specified output voltage is used to generate a signal for transmission to an output driver circuit associated with a memory device.

24. The divider circuit of claim 17, wherein the pairs of series coupled PMOS transistors include a select transistor and a load transistor and the pairs of NMOS transistors include a select transistor and a load transistor.

25. The divider circuit of claim 24, wherein a ratio of a gate width of the select to the gate width of the load transistor is 2.

26. The divider circuit of claim 24, wherein a ratio of a geometry of the PMOS select transistors to the PMOS load transistors is adjusted to match a process.

27. The divider circuit of claim 17, wherein the first circuit and the second circuit are configured to receive a coded signal.

28. The driver circuit of claim 27, wherein the coded signal is an m-bit wide signal.

29. The divider circuit of claim 17, wherein the shunt resistor is coupled between the first circuit and ground.

30. The divider circuit of claim 17, wherein the resistor is at least one of an internally calibrated resistance and an external fixed resistance.

31. The divider circuit of claim 17, wherein the specified output voltage is determined by the M signals and the N signals.

32. The divider circuit of claim 17, wherein an output associated with the specified voltage output is electrically coupled to a differential amplifier.

* * * * *